US012610670B2

(12) United States Patent     (10) Patent No.:   US 12,610,670 B2

He et al.     (45) Date of Patent:    Apr. 21, 2026

(54) LAMP BEAD AND DISPLAY DEVICE

(71) Applicants:CHANGSHA HKC OPTOELECTRONICS CO., LTD., Changsha City (CN); HKC CORPORATION LIMITED, Shenzhen (CN)

(72) Inventors: Hailong He, Changsha City (CN); Haijiang Yuan, Changsha City (CN)

(73) Assignees: CHANGSHA HKC OPTOELECTRONICS CO., LTD., Changsha City (CN); HKC CORPORATION LIMITED, Shenzhen (CN)

( * ) Notice: Subject to any disclaimer, the term of this patent is extended or adjusted under 35 U.S.C. 154(b) by 630 days.

(21) Appl. No.: 18/145,764

(22) Filed: Dec. 22, 2022

(65) Prior Publication Data

US 2023/0387362 A1     Nov. 30, 2023

(30) Foreign Application Priority Data

May 31, 2022    (CN) .......................... 202210605181.5

(51) Int. Cl.
   *H10H 20/00*      (2025.01)
   *H10H 20/813*      (2025.01)
         (Continued)

(52) U.S. Cl.
   CPC ........ *H10H 20/853* (2025.01); *H10H 20/813* (2025.01); *H10H 20/831* (2025.01); *H10H 20/856* (2025.01); *H10H 20/857* (2025.01)

(58) Field of Classification Search
CPC .. H10H 20/853; H10H 20/813; H10H 20/831; H10H 20/856; H10H 20/857; H10H 20/855; H01L 25/0753; G09F 9/33
(Continued)

(56) References Cited

U.S. PATENT DOCUMENTS 7,503,683 B2 * 3/2009 Liu .......................... H04M 1/22
                                        362/616
2008/0244943 A1 * 10/2008 Varrin ...................... G09F 9/30
                                        29/428
(Continued)

FOREIGN PATENT DOCUMENTS

CN       102537754       7/2012
CN       110953506       4/2020
(Continued)

OTHER PUBLICATIONS

CNIPA, First Office Action for CN Application No. 202210605181. 5, Jun. 26, 2025.

*Primary Examiner* — Sheikh Maruf
(74) *Attorney, Agent, or Firm* — Hodgson Russ LLP

(57) ABSTRACT

A lamp bead structure is used for connection to at least two mutually independent control lines. The lamp bead structure includes a light-guiding element and a light-emitting element. The light-guiding element is provided with a light output region and a light input region. At least two light-emitting elements are provided to be connected to the control lines in a one-to-one correspondence. Light emitted by the light-emitting element is able to enter the light-guiding element through the light input region and exit through the same light output region.

18 Claims, 2 Drawing Sheets

(51) Int. Cl.
  *H10H 20/831* (2025.01)
  *H10H 20/853* (2025.01)
  *H10H 20/856* (2025.01)
  *H10H 20/857* (2025.01)

(58) Field of Classification Search
  USPC .......................................................... 257/79
  See application file for complete search history.

(56) References Cited

U.S. PATENT DOCUMENTS

| | | | | |
|---|---|---|---|---|
| 2008/0257699 | A1* | 10/2008 | Sung ...................... | H01H 13/83 |
| | | | | 200/314 |
| 2009/0140650 | A1* | 6/2009 | Chou ................. | H01L 25/0753 |
| | | | | 313/512 |
| 2011/0013377 | A1* | 1/2011 | Kim ................. | G02F 1/133603 |
| | | | | 362/249.02 |
| 2011/0051409 | A1* | 3/2011 | Nearman ............. | F21V 31/005 |
| | | | | 257/E33.056 |
| 2011/0227895 | A1 | 9/2011 | Takahashi et al. | |
| 2012/0090973 | A1* | 4/2012 | Liu ........................ | H01H 13/83 |
| | | | | 200/5 A |
| 2013/0145588 | A1* | 6/2013 | Nakata ...................... | D03J 1/00 |
| | | | | 29/25.01 |
| 2013/0163021 | A1* | 6/2013 | Kinoshita ........... | H04N 1/1938 |
| | | | | 358/475 |
| 2013/0300714 | A1* | 11/2013 | Goh ...................... | G06F 3/0421 |
| | | | | 345/175 |
| 2014/0313733 | A1* | 10/2014 | Takeuchi .......... | G02F 1/133605 |
| | | | | 362/382 |
| 2014/0340897 | A1* | 11/2014 | Thijssen ................. | F21S 8/022 |
| | | | | 29/428 |
| 2016/0145096 | A1* | 5/2016 | Allegato ................. | B81B 7/007 |
| | | | | 257/419 |
| 2016/0209569 | A1* | 7/2016 | Cho ...................... | G02B 6/0076 |
| 2017/0176652 | A1* | 6/2017 | Wheatley .......... | G02F 1/133362 |
| 2020/0161283 | A1* | 5/2020 | Mun .................. | H10H 20/8316 |
| 2021/0408110 | A1* | 12/2021 | Guan ................. | H10H 20/8506 |
| 2022/0039697 | A1* | 2/2022 | Higano ................. | G02B 6/005 |

FOREIGN PATENT DOCUMENTS

| | | |
|---|---|---|
| CN | 113594147 | 11/2021 |
| CN | 114019726 | 2/2022 |
| KR | 20160045235 | 4/2016 |

* cited by examiner

10

LAMP BEAD AND DISPLAY DEVICE

CROSS-REFERENCE TO RELATED APPLICATION

This application claims priority to Chinese Patent Application No. 202210605181.5, filed May 31, 2022, the entire contents of which are incorporated herein by reference.

FIELD OF TECHNOLOGY

The present application relates to the field of display technology and, more particularly, to a lamp bead structure and a display device.

BACKGROUND

With the development of display technology, Mini LED (sub-millimeter light-emitting diode) display devices have begun to be applied in the field of commercial display. A display screen contains thousands of LED (light-emitting diode) lamp beads, which are complex in both materials and processes, resulting in high cost and price of the product. Therefore, the requirements for raw materials and production process of Mini LED display screen are extremely high, so as to ensure that the yield of products meets the requirements. Once a lamp bead is damaged and cannot luminesce, it will directly lead to defects in the whole display screen, which will affect the display effect and use experience.

SUMMARY

There are provided a lamp bead structure and a display device according to embodiments of the present disclosure. The technical solution is as below:

According to a first aspect of the present disclosure, there is provided a lamp bead structure, for connection to at least two mutually independent control lines. The lamp bead structure includes:

a light-guiding element provided with a light output region and a light input region; and at least two light-emitting elements connected to the control lines in a one-to-one correspondence, wherein each light-emitting element is arranged opposite to the light input region of the light-guiding element;

light emitted by the light-emitting elements is able to enter the light-guiding element through the light input region and exit through the same light output region.

According to a second aspect of the present disclosure, there is provided a display device including a drive backplane and the lamp bead structure as described above, the driving backplane is provided with a control line thereon.

It should be understood that the above general description and the following detailed description are exemplary and illustrative only and are not intended to limit the present application.

BRIEF DESCRIPTION OF THE DRAWINGS

The accompanying drawings which are incorporated in and constitute a part of the description illustrate embodiments consistent with the disclosure and together with the description serve to explain the principles of the disclosure. It will be apparent that the drawings described below are only some embodiments of the present disclosure, and other drawings may be obtained from them without creative effort for those of ordinary skill in the art.

DETAILED DESCRIPTION OF THE EMBODIMENTS

Exemplary embodiments will now be described more comprehensively with reference to the accompanying drawings. However, the exemplary embodiments can be implemented in a variety of forms and should not be construed as being limited to the examples set forth herein. Rather, these embodiments are provided so that the present disclosure will be more comprehensive and complete, and the concept of exemplary embodiments will be fully communicated to those skilled in the art.

Further, the described features, structures or characteristics may be incorporated in any suitable manner in one or more embodiments. In the following description, many specific details are provided to give a full understanding of the embodiments of the present application. However, those skilled in the art will appreciate that one or more of the technical solutions of the present application may be practiced without particular details, or other methods, group elements, devices, steps, etc. may be employed. In other instances, well-known methods, devices, implementations or operations are not shown or described in detail to avoid obscuring aspects of the present application.

The present application is described in further detail below in conjunction with the accompanying drawings and specific embodiments. It should be noted here that the technical features involved in the various embodiments of the present application described below can be combined with each other as long as they do not conflict with each other. The embodiments described below by reference to the accompanying drawings are exemplary and are intended to be used for explanation of the present application and are not to be construed as limiting.

Embodiment 1

Figure 1:
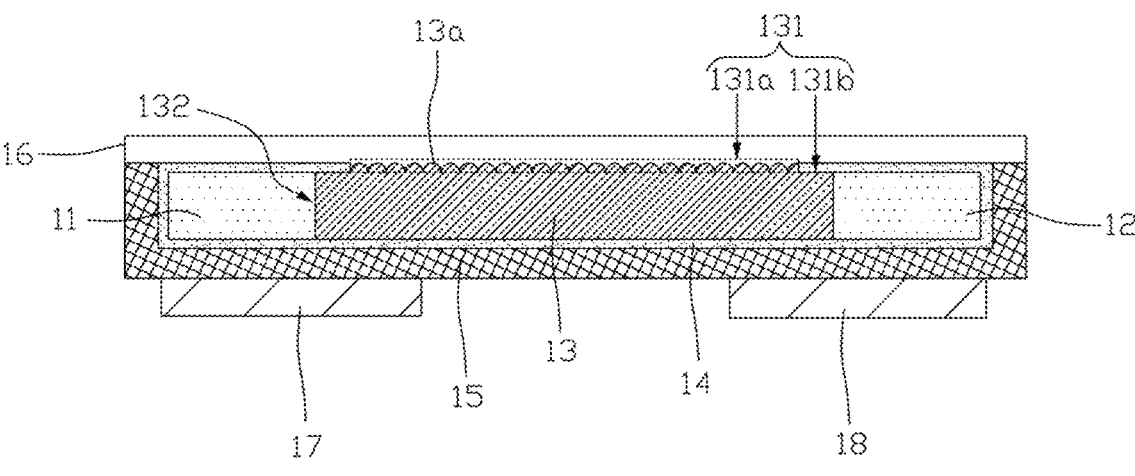
FIG. 1 shows a cross-sectional structural diagram of a lamp bead structure according to an embodiment of the present disclosure.
Figure 2:
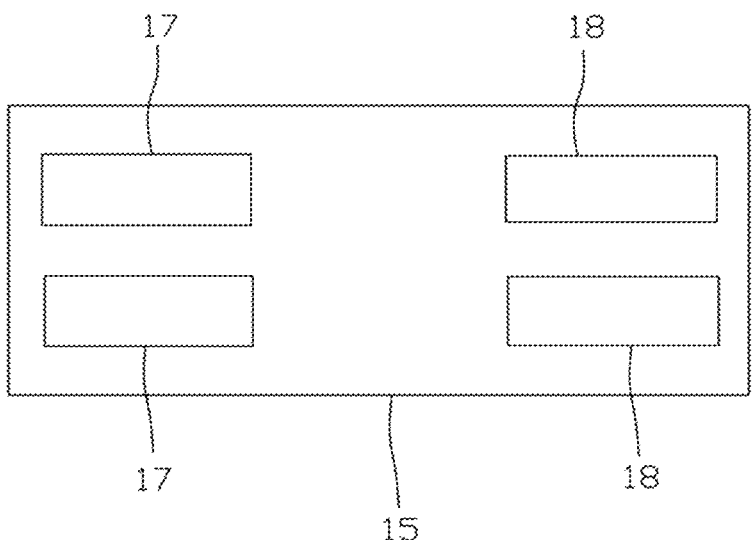
FIG. 2 shows a bottom view structural diagram of the lamp bead structure of embodiment 1 of the present disclosure.

As shown in FIGS. 1 and 2, embodiment 1 of the present disclosure provides a lamp bead structure 10. The lamp bead structure 10 is a Mini LED (sub-millimeter light-emitting diode) for connection with at least two mutually independent control lines.

The lamp bead structure 10 includes a light-emitting element, an electrode group, and a light-guiding element. The light-guiding element is used to disperse the light emitted by the light-emitting element and uniformly emit light toward the same light output region 131a. The light-emitting element is electrically connected to the control line through the electrode group.

Optionally, at least two light-emitting elements are provided, and at least two electrode groups are arranged, and each electrode group is insulated from the other, and the light-emitting elements are connected to different control lines through the electrode groups in a one-to-one correspondence manner.

In this embodiment, for example, there are two light-emitting elements, namely a first light-emitting element 11 and a second light-emitting element 12, and the second light-emitting element 12 is a spare light-emitting element. The electrode groups are, for example, a first electrode group 17 and a second electrode group 18. The control lines are, for example, a first control line 21 and a second control line 22. The specific relationship among the first light-emitting element 11 and the second light-emitting element 12, the first electrode group 17 and the second electrode group 18 which are insulated from each other, the first control line 21 and the second control line 22 which are insulated from each other, and the light-guiding element will be described as follows:

For example, the first electrode group 17 and the second electrode group 18 each include positive and negative electrodes. The first light-emitting element 11 is electrically connected to the first control line 21 through the positive and negative of the first electrode group 17, and the second light-emitting element 12 is electrically connected to the second control line 22 through the positive and negative of the second electrode group 18.

It should be understood that when the drive backplane 20 controls only the first control line 21 to be powered on, the second control line 22 is not powered on simultaneously with the first control line 21 and vice versa. When the first light-emitting element 11 is in normal display, the second light-emitting element 12 is in a non-display state, and the service life of the second light-emitting element 12, which is a standby light-emitting element, is prevented from being attenuated in advance.

Alternatively, in some embodiments, the first control line 21 can be powered on through the drive backplane 20, and then the second control line 22 can be powered on, so that the first light-emitting element 11 and the second light-emitting element 12 can emit light at the same time in a certain time period. For example, the display effect of the first light-emitting element 11 has been greatly attenuated. In order to reduce the delay time for the lamp bead structure 10 to switch from the first light-emitting element 11 to the second light-emitting element 12, the second light-emitting element 12 can be enabled in advance by program control of the drive backplane 20 when the first light-emitting element 11 is about to be completely damaged, thereby achieving seamless switching between the first light-emitting element 11 and the second light-emitting element 12.

In this embodiment, the light-guiding element includes a light guide plate 13 and a reflective plate 14. The light guide plate 13 has a light output region 131a and a light input region. The reflective plate 14 covers the other surfaces of the light guide plate 13 except for the light output region 131a. Accordingly, the first light-emitting element 11 and the second light-emitting element 12 are both located between the reflective plate 14 and the light input region of the light guide plate 13, and the first light-emitting element 11 and the second light-emitting element 12 are provided symmetrically with respect to the center of the light output region 131a.

It should be understood that when the reflective plate 14 covers the other surfaces of the light guide plate 13 other than the light output region 131a, and the first light-emitting element 11 and the second light-emitting element 12 are located between the reflective plate 14 and the light input region of the light guide plate 13, part of the light emitted by the first light-emitting element 11 and the second light-emitting element 12 can directly enter the light input region and then exit from the light output region 131a, and another part of the light emitted by the first light-emitting element 11 and the second light-emitting element 12 is emitted to the reflective plate 14, then is reflected by the reflective plate 14, then enters the inside of the light guide plate 13 through the light input region, and finally emitted from the light output region 131a of the light guide plate 13.

Optionally, the reflectivity of the reflective plate 14 is greater than 90% to ensure that most of light irradiated on the reflective plate 14 can be reflected back without passing through the reflective plate.

Optionally, the light guide plate 13 is made of, for example, acrylic or PC plate.

In this embodiment, the light guide plate 13 has for example a cuboid shape and has a top surface 131, a bottom surface disposed opposite each other and a side circumferential surface 132 vertically connected between the top surface 131 and the bottom surface.

The top surface 131 includes the light output region 131a and a top edge region 131b disposed around the light output region 131a. The top edge region 131b, the side circumferential surface 132 and the bottom surface are all covered by the reflective plate 14.

For example, the side circumferential surface 132 of the light guide plate 13 has at least two oppositely disposed light input regions. The first light-emitting element 11 and the second light-emitting element 12 are respectively provided in close proximity to the two light input regions, so that the emitted light is conveniently emitted into the light guide plate 13 from the light input regions, and the size of the lamp bead structure 10 in a height direction can be reduced so that the lamp bead structure 10 is provided with other structures in the height direction of the light guide plate 13.

It should be noted that the light input region of the light guide plate 13 is spaced from the reflective plate 14 to form a mounting space, the first light-emitting element 11 and the second light-emitting element 12 are provided in the mounting space, so as to ensure that the light emitted from the first light-emitting element 11 and the second light-emitting element 12 towards the light input region will not be obstructed by the reflective plate 14, and the light emitted from the first light-emitting element 11 and the second light-emitting element 12 towards the other sides will irradiate the light guide plate 13, and finally the light will be reflected to the light input region through the reflective plate 14.

It should be understood that since the first light-emitting elements 11 and the second light-emitting elements 12 are disposed in close proximity to the light input regions of the light guide plate 13, there may be gaps between the first light-emitting elements 11 and the side circumferential surface 132 of the light guide plate 13 and between the second light-emitting elements 12 and the side circumferential surface 132 of the light guide plate 13, resulting in a light leakage phenomenon. In order to avoid this phenomenon, the first light-emitting element 11 and the second light-emitting element 12 may be wrapped between the reflective plate 14 and the light guide plate 13 by the reflective plate 14, and the reflective plate 14 may be covered to the top edge region 131b of the light guide plate 13, so that only the light output region 131a of the light guide plate 13 is exposed. In this case, even if there may be gaps between the first light-emitting elements 11 and the side circumferential surface 132 of the light guide plate 13 and between the second light-emitting elements 12 and the side circumferential surface 132 of the light guide plate 13, the light may be reflected back by the reflective plate 14 and finally emitted out from the light output region 131a of the light guide plate 13, when the light emitted from the first light-emitting elements 11 and the second light-emitting elements 12 is emitted toward the top surface 131 of the light guide plate 13.

In the present embodiment, the light output region 131a of the light guide plate 13 is further provided with a microstructure 13a to disrupt the total reflection of the light within the light guide plate 13, thereby facilitating the exiting of the light at the interface and having a gathering effect on the light.

For example, the microstructure 13a is provided in the light output region 131a of the light-guiding element over its entire surface, and may have a spherical convex structure, a concave structure, a cylindrical deformation structure or the like.

It should be understood that the exit path of light passing through the microstructure can be adjusted by adjusting the arrangement of the microstructure and the spacing relationship or angle relationship between the various surfaces of the microstructure itself. In this embodiment, the arrangement of the microstructure 13a enables the light incident from two opposite sides of the light guide plate 13 to be gathered in the light output region 131a of the light guide plate 13, and then uniformly emitted from the light output region 131a, thereby reducing the influence that the light emitted by the first light-emitting element 11 and the second light-emitting element 12 is slightly different due to the different arrangement positions of the first light-emitting element 11 and the second light-emitting element 12.

In the present embodiment, the lamp bead structure 10 further includes an encapsulating element 15 and a transparent protective layer 16. The first light-emitting element 11, the second light-emitting element 12, the light guide plate 13 and the reflective plate 14 are all fixed in the encapsulating element 15. The transparent protective layer 16 is fixedly connected to the encapsulating element 15 and covers the top surfaces of the first light-emitting element 11 and the second light-emitting element 12, the light guide plate 13 and the reflective plate 14.

As an example, a fitting groove is provided in the encapsulating element 15, and the reflective plate 14 is attached to a groove wall of the whole fitting groove. The first light-emitting element 11 and the second light-emitting element 12 are respectively located at both sides of the fitting groove, and the light guide plate 13 is located between the first light-emitting element 11 and the second light-emitting element 12. The transparent protective layer 16 covers the notch of the fitting groove of the encapsulating element 15 to seal the first light-emitting element 11, the second light-emitting element 12, the reflective plate 14, and the light guide plate 13 in the fitting groove.

In addition, a first electrode group 17 and a second electrode group 18 are located outside the encapsulating element 15 and are respectively connected to the first light-emitting element 11 and the second light-emitting element 12.

It should be understood that the transparent protective layer 16 is disposed opposite to the light output region 131a so that light is emitted from the transparent protective layer 16. Specifically, the transparent protective layer 16 is directly coated on the surface of the microstructure 13a of the light output region 131a, and may be a flat surface, or may further be provided with a prismatic structure 161 to control the display angle of view.

In the embodiment of the present disclosure, since the lamp bead structure 10 includes at least two light-emitting elements, and each of the light-emitting elements is connected to an independent control circuit in a one-to-one correspondence. Therefore, when the lamp bead structure 10 is in operation, one light-emitting element of a plurality of light-emitting elements can be controlled to work through a corresponding control line, and makes the remaining light-emitting elements not work as standby light-emitting elements, until the working light-emitting element is damaged, then one of the standby light-emitting elements is controlled to work by another control line, to replace the previous damaged light-emitting element, thereby ensuring that the standby light-emitting element can be used to ensure the normal light emission of the lamp bead structure 10 under the condition that the lamp bead structure 10 is damaged without repairing the lamp bead structure 10, thereby finally prolonging the service life of the lamp bead structure 10. Further, the arrangement of the light guide plate 13 and the reflective plate 14 enables the light emitted from the light-emitting elements provided at different positions to be emitted from the same light output region 131a, thereby increasing the light-emitting efficiency. Furthermore, by providing the microstructure 13a on the light guide plate 13 and the prismatic structure 161 on the transparent protective layer 16, it is possible to ensure that the lamp bead structure 10 emits light uniformly.

Embodiment 2

Figure 3:
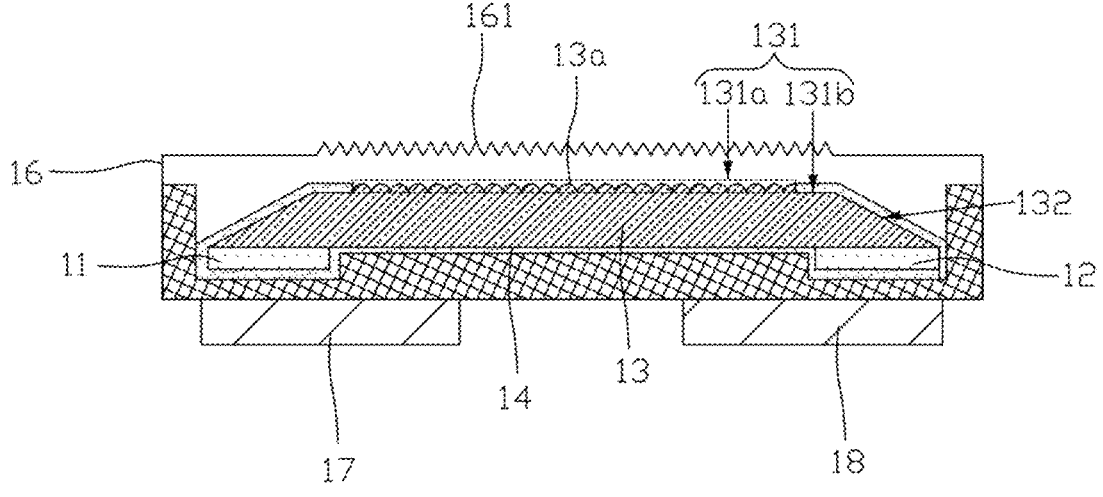
FIG. 3 shows a cross-sectional structural diagram of the lamp bead structure according to embodiment 2 of the present disclosure.

As shown in FIG. 3, the lamp bead structure of this embodiment is substantially the same as the lamp bead structure of the first embodiment, except that the structure of the light-guiding element of this embodiment is different from that of the light-guiding element of the first embodiment, and the position of the light input region of this embodiment is different from that of the light input region of the first embodiment. Specifically, the light-emitting elements of this embodiment are, for example, the first light-emitting element 11 and the second light-emitting element 12 as in the first embodiment.

In this embodiment, the bottom surface of the light guide plate 13 has at least two light input regions provided at intervals, each of which is provided adjacent to at least one light-emitting element, i.e., the first light-emitting element 11 is provided corresponding to one of the two light input regions provided at intervals, and the second light-emitting element 12 is provided corresponding to another light input region.

It should be understood that the first light-emitting element 11 and the second light-emitting element 12 are provided on the bottom surface of the light guide plate 13, and an overall width or length of the lamp bead structure 10 can be reduced so that the lamp bead structure 10 is provided with other structures in the width direction or the length direction of the light guide plate 13.

Further, an area of the top surface 131 of the light guide plate 13 is smaller than an area of the bottom surface, and an orthographic projection of the top surface 131 on the bottom surface is located in a central region of the bottom surface. Meanwhile, the side circumferential surface 132 of the light guide plate 13 is provided obliquely between the top surface 131 and the bottom surface, and both sides thereof are connected to the edges of the top surface and the bottom surface, respectively, and an angle between the side circumferential surface 132 and the bottom surface is $\alpha$, $30° \leq \alpha \leq 60°$. Alternatively, $\alpha=30°$, $\alpha=40°$, $\alpha=45°$, $\alpha=50°$, or $\alpha=60°$.

Accordingly, the reflective plate 14 is attached to other surfaces of the light guide plate 13 other than the light output region and the light input region.

It should be understood that, the first light-emitting element 11 and the second light-emitting element 12 are provided on two light input regions, respectively on the bottom surface of the light guide plate 13, and the light output region 131a is located on the top surface 131 of the light guide plate 13. The side circumferential surface 132 of the light guide plate 13 is obliquely arranged between the top surface 131 and the bottom surface, and the reflective plate 14 is attached to the other surface of the light guide plate 13 other than the light output region and the light input region. In these case, the light emitted by the first light-emitting element 11 and the second light-emitting element 12 enters the light guide plate, part of the light emitted through the obliquely arranged side circumferential surface 132 reaches the reflective plate 14, and then the light emitted directly from the first light-emitting element 11 and the second light-emitting element 12 is reflected through the reflective plate 14 corresponding to the side circumferential surface 132 to a middle area inside the light guide plate 13, and finally is conveniently emitted from the light output region 131a of the light guide plate 13.

Further, the orthographic projection of the light output region 131a on the bottom surface of the light guide plate 13 does not overlap and is spaced apart from the light input region, and the two light input regions are provided symmetrically with respect to the center of the light output region 131a.

In the present embodiment, the lamp bead structure 10 further includes an encapsulating element 15 and a transparent protective layer 16. The first light-emitting element 11, the second light-emitting element 12, the light guide plate 13 and the reflective plate 14 are all fixed in the encapsulating element 15. The transparent protective layer 16 is fixedly connected to the encapsulating element 15 and covers the top surfaces of the first light-emitting element 11 and the second light-emitting element 12, the light guide plate 13 and the reflective plate 14.

Further, a first groove and a second groove are provided at the groove bottom of the fitting groove, and the first light-emitting element 11 and the second light-emitting element 12 are respectively mounted in the first groove and the second groove, so as to thin the whole lamp bead structure 10. In addition, a raised bump is formed between the first groove and the second groove, and a thickness of the bump plus a thickness of the reflective plate 14 is equal to the thickness of the first light-emitting element 11 or the thickness of the second light-emitting element 12, so that the light guide plate 13 can be flatly installed in the fitting groove.

Based on this, the lamp bead structure 10 in the embodiment of the present disclosure can ensure that the lamp bead structure 10 can normally emit light by using the standby light-emitting element when the lamp bead structure 10 is damaged, without repairing the lamp bead structure 10, thereby prolonging the service life of the lamp bead structure 10.

Further, the side circumferential surface 132 of the light guide plate 13 is obliquely arranged between the top surface 131 and the bottom surface, and the reflective plate 14 is attached to the surface of the light guide plate 13 other than the light output region and the light input region. In that way, the light emitted from both ends of the first light-emitting element 11 and the second light-emitting element 12 from the light guide plate 13 can be reflected to the middle area of the light guide plate 13, thereby facilitating the uniform emission of the light from the light output region 131a of the light guide plate 13.

Furthermore, at least two grooves are provided in the bottom wall of the fitting groove of the encapsulating element 15, that is, for example, a first groove and a second groove. When the first light-emitting element 11 and the second light-emitting element 12 are respectively mounted in the first groove and the second groove, the entire lamp bead structure 10 can be thinned.

For other structures of the lamp bead structure, please refer to embodiment 1, which will not be described here.

Embodiment 3

Figure 4:
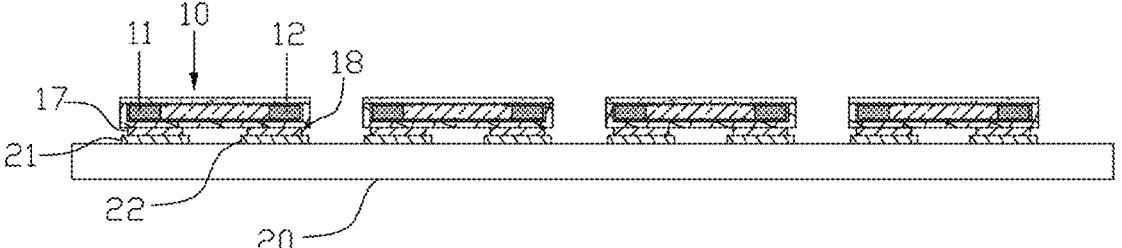
FIG. 4 shows a partial cross-sectional structural diagram of a display device according to embodiment 2 of the present disclosure.

As shown in FIG. 4, embodiment 3 of the present disclosure provides a display device including a driving backplane and the lamp bead structure of embodiment 1 or embodiment 2.

In this embodiment, a plurality of lamp bead structures 10 and control lines corresponding to the lamp bead structures 10 are provided on the drive backplane 20.

For example, each of the control lines is connected to a drive line on the drive backplane 20.

It should be understood that a detection unit is provided on the drive line. When the first light-emitting element 11 of one of the lamp bead structures 10 is damaged and cannot continue to work, the detection unit on the drive line will automatically turn on the control line connected to the second light-emitting element 12, so as to control the second light-emitting element 12 to emit light and ensure that the lamp bead structure 10 emits light normally.

The detection unit may include a photosensitive element or a thermal sensitive element, which can detect an optical signal or a thermal signal in the lamp bead structure and feed it back to the drive line for adjustment and control. Regardless of whether the first light-emitting element 11 or the second light-emitting element 12 of the lamp bead structure 10 emits light, the light output region 131a remains unchanged, so that the overall display image of the display device is not affected.

In addition, the display area of the display device is provided with a plurality of pixel areas arranged in an array, and each pixel area corresponds to at least one lamp bead structure 10.

Based on this, the life of the display device is improved in this disclosed embodiment, as the lamp bead structure 10 has multiple light emitting element structures in a single pixel within the display area, thus ensuring that in case the structure of the first light-emitting element 11 in a lamp bead structure 10 is damaged, a standby second light-emitting element 12 can be used to ensure that the lamp bead structure 10 can emit light normally without affecting the display effect, and there is no need for maintenance of the display device.

Please refer to embodiment 1 or embodiment 2 for other structures of the lamp bead structure of the display device, which will not be repeated here.

In addition, the terms of "first", "second" are for descriptive purposes only and cannot be construed as indicating or implying relative importance or implying the number of the indicated technical features. Thus, the features defined as "first" or "second" may be explicitly or implicitly defined as including one or more of the features. In the description of the present application, "a plurality of" means two or more, unless explicitly and specifically defined otherwise.

In the present application, the terms "assembly", "connection" and the like are understood in a broad sense and may be, for example, a fixed connection, a detachable connection, or as a unit, unless otherwise expressly specified and limited; the connection can be a mechanical connection or an electrical connection; or the connection can be a directly connection or an indirect connection by intermediate media, and it can be the internal communication of two elements or the interaction between two elements. For those ordinarily skilled in the art, the specific meanings of the above terms in the present application will be understood according to the specific circumstances.

In the description of this description, illustrations of the reference terms "some embodiments", "exemplified", etc. mean that specific features, structures, materials, or features described in connection with the embodiment or example are included in at least one embodiment or example of the present application. In this description, the schematic formulation of the above terms need not be directed to the same embodiments or examples. Further, the specific features, structures, materials or characteristics described may be combined in a suitable manner in any one or more embodiments or examples. Further, without contradicting one another, those skilled in the art may connect and combine different embodiments or examples described in this description and features of different embodiments or examples.

Although the embodiments of the present application have been shown and described above, understandably, the above-described embodiments are exemplary and cannot be construed as limiting the present application. Those of ordinary skill in the art may make changes, modifications, substitutions and modifications to the above-described embodiments within the scope of the present application. Therefore, any changes or modifications made in accordance with the claims and descriptions of the present application should fall within the scope of the present application.

What is claimed is:

1. A lamp bead structure, for connection to at least two mutually independent control lines, comprising:
   a light-guiding element provided with a light output region and a light input region; and
   at least two light-emitting elements connected to the control lines in one-to-one correspondence, wherein each light-emitting element is arranged opposite to the light input region of the light-guiding element;
   wherein light emitted by the at least two light-emitting elements is able to enter the light-guiding element through the light input region and exit through the same light output region;
   wherein the light-guiding element comprises:
      a light guide plate provided with the light output region and the light input region; and
      a reflective plate covering other surfaces of the light guide plate except the light output region;
   wherein the at least two light-emitting elements are located between the reflective plate and the light input region of the light guide plate.

2. The lamp bead structure according to claim 1, wherein the light guide plate has opposing top surface and bottom surface, and a side circumferential surface connecting the top surface and the bottom surface; and
   wherein the top surface comprises the light output region and a top edge area arranged around the light output region, and the top edge area, the side circumferential surface and the bottom surface are covered by the reflective plate.

3. The lamp bead structure according to claim 2, further comprising:
   an encapsulating element provided with a fitting groove that is fitted with the light-emitting element and the light-guiding element are assembled;
   a transparent protective layer for covering a notch of the fitting groove, wherein the light output region is opposite to the transparent protective layer to allow light to be emitted from the transparent protective layer; and
   at least two electrode groups located outside the encapsulating element and connected to the at least two light-emitting elements in one-to-one correspondence, wherein each light-emitting element is connected to the control line through one electrode group.

4. The lamp bead structure according to claim 3, wherein the side circumferential surface of the light guide plate is provided with at least two light input regions oppositely disposed, and each of the at least two light input regions is disposed adjacent to at least one light-emitting element.

5. The lamp bead structure according to claim 3, wherein the bottom surface of the light guide plate is provided with at least two light input regions arranged at intervals, and each of the at least two light input regions is disposed adjacent to at least one light-emitting element; and
   wherein an orthographic projection of the light output region on the bottom surface of the light guide plate and the light input region are nonoverlapping.

6. The lamp bead structure according to claim 5, wherein the orthographic projection of the light output region on the bottom surface of the light guide plate is spaced from the light input region.

7. The lamp bead structure according to claim 5, wherein an area of the top surface is smaller than an area of the bottom surface, and an orthographic projection of the top surface on the bottom surface is located in a central region of the bottom surface; and
   wherein the side circumferential surface is obliquely arranged, two sides of the side circumferential surface are respectively connected to edges of the top surface and the bottom surface, and an angle between the side circumferential surface and the bottom surface is $\alpha$, $30°\leq\alpha\leq60°$.

8. The lamp bead structure according to claim 5, wherein at least two grooves are disposed at a bottom of the fitting groove and disposed in one-to-one correspondence to the at least two light input regions, and wherein each groove is provided with at least one light-emitting element therein.

9. The lamp bead structure according to claim 3, wherein the transparent protective layer is provided with a prismatic structure to control a display angle of view.

10. The lamp bead structure according to claim 1, wherein the light output region of the light guide plate is provided with a microstructure to disrupt total reflection of the light within the light guide plate.

11. A display device comprising:
   a drive backplane provided with at least two mutually independent control lines thereon; and
   a lamp bead structure, for connection to the at least two mutually independent control lines, comprising:
      a light-guiding element provided with a light output region and a light input region; and
      at least two light-emitting elements connected to the control lines in one-to-one correspondence, wherein each light-emitting element is arranged opposite to the light input region of the light-guiding element;

wherein light emitted by the at least two light-emitting elements is able to enter the light-guiding element through the light input region and exit through the same light output region;

wherein the light-guiding element comprises:

a light guide plate provided with the light output region and the light input region; and a reflective plate covering other surfaces of the light guide plate except the light output region;

wherein the at least two light-emitting elements are located between the reflective plate and the light input region of the light guide plate.

12. The display device according to claim 11, wherein the light guide plate has opposing top surface and bottom surface, and a side circumferential surface connecting the top surface and the bottom surface; and wherein the top surface comprises the light output region and a top edge area arranged around the light output region, and the top edge area, the side circumferential surface and the bottom surface are covered by the reflective plate.

13. The display device according to claim 12, further comprising:

an encapsulating element provided with a fitting groove that is fitted with the light-emitting element and the light-guiding element are assembled;

a transparent protective layer for covering a notch of the fitting groove, wherein the light output region is opposite to the transparent protective layer to allow light to be emitted from the transparent protective layer; and at least two electrode groups located outside the encapsulating element and connected to the at least two light-emitting elements in one-to-one correspondence, wherein each light-emitting element is connected to the control line through one electrode group.

14. The display device according to claim 13, wherein the side circumferential surface of the light guide plate is provided with at least two light input regions oppositely disposed, and each of the at least two light input regions is disposed adjacent to at least one light-emitting element.

15. The display device according to claim 13, wherein the bottom surface of the light guide plate is provided with at least two light input regions arranged at intervals, and each of the at least two light input regions is disposed adjacent to at least one light-emitting element; and wherein an orthographic projection of the light output region on the bottom surface of the light guide plate and the light input region are nonoverlapping.

16. The display device according to claim 15, wherein the orthographic projection of the light output region on the bottom surface of the light guide plate is spaced from the light input region.

17. The display device according to claim 15, wherein an area of the top surface is smaller than an area of the bottom surface, and an orthographic projection of the top surface on the bottom surface is located in a central region of the bottom surface; and wherein the side circumferential surface is obliquely arranged, two sides of the side circumferential surface are respectively connected to edges of the top surface and the bottom surface, and an angle between the side circumferential surface and the bottom surface is $\alpha$, $30° \leq \alpha \leq 60°$.

18. The display device according to claim 15, wherein at least two grooves are disposed at a bottom of the fitting groove and disposed in one-to-one correspondence to the at least two light input regions, and wherein each groove is provided with at least one light-emitting element therein.

\* \* \* \* \*